United States Patent
Eum et al.

(10) Patent No.: US 12,476,119 B2
(45) Date of Patent: Nov. 18, 2025

(54) SUBSTRATE PROCESSING APPARATUS AND SUBSTRATE PROCESSING METHOD

(71) Applicant: SEMES CO., LTD., Cheonan-si (KR)

(72) Inventors: Ki Sang Eum, Cheonan-si (KR); Dong Woon Park, Cheonan-si (KR); Young Jun Son, Cheonan-si (KR); Woo Ram Lee, Cheonan-si (KR); Jin Ho Choi, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 18/523,893

(22) Filed: Nov. 30, 2023

(65) Prior Publication Data

US 2024/0186155 A1 Jun. 6, 2024

(30) Foreign Application Priority Data

Dec. 1, 2022 (KR) ........................ 10-2022-0165523

(51) Int. Cl.
*A47L 15/44* (2006.01)
*H01L 21/67* (2006.01)
*H01L 21/687* (2006.01)

(52) U.S. Cl.
CPC .... *H01L 21/67051* (2013.01); *H01L 21/6719* (2013.01); *H01L 21/67196* (2013.01); *H01L 21/67253* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 11,495,451 B2 | 11/2022 | Truong | |
| 2022/0203408 A1 | 6/2022 | Lim et al. | |

FOREIGN PATENT DOCUMENTS

| | | | | |
|---|---|---|---|---|
| KR | 20010006799 A | * | 1/2001 | |
| KR | 10-2005-0087314 | | 8/2005 | |
| KR | 20080015647 A | * | 2/2008 | ......... H01L 21/6708 |
| KR | 10-2020-006000 | | 1/2020 | |
| KR | 10-2022-0095614 | | 7/2022 | |

OTHER PUBLICATIONS

Google Patents translation of KR20010006799A (Year: 2025).*
Google Patents translation of KR20080015647A (Year: 2025).*

* cited by examiner

*Primary Examiner* — Eric W Golightly

(57) ABSTRACT

Proposed is a substrate processing apparatus for cleaning the bottom surface of a substrate. The apparatus includes a processing container configured to form a processing space for a substrate, a substrate support unit provided inside the processing space and configured to support the substrate, a first nozzle unit configured to have a first nozzle member provided on a side of the substrate support unit inside the processing space and supplying a processing fluid toward a center area of a bottom surface of the substrate, and a second nozzle member provided to be fixedly coupled to the substrate support unit and supplying a processing fluid toward an edge area of the bottom surface of the substrate, wherein the first nozzle member is provided to rotate between a center position and an end position of the bottom surface of the substrate.

15 Claims, 12 Drawing Sheets

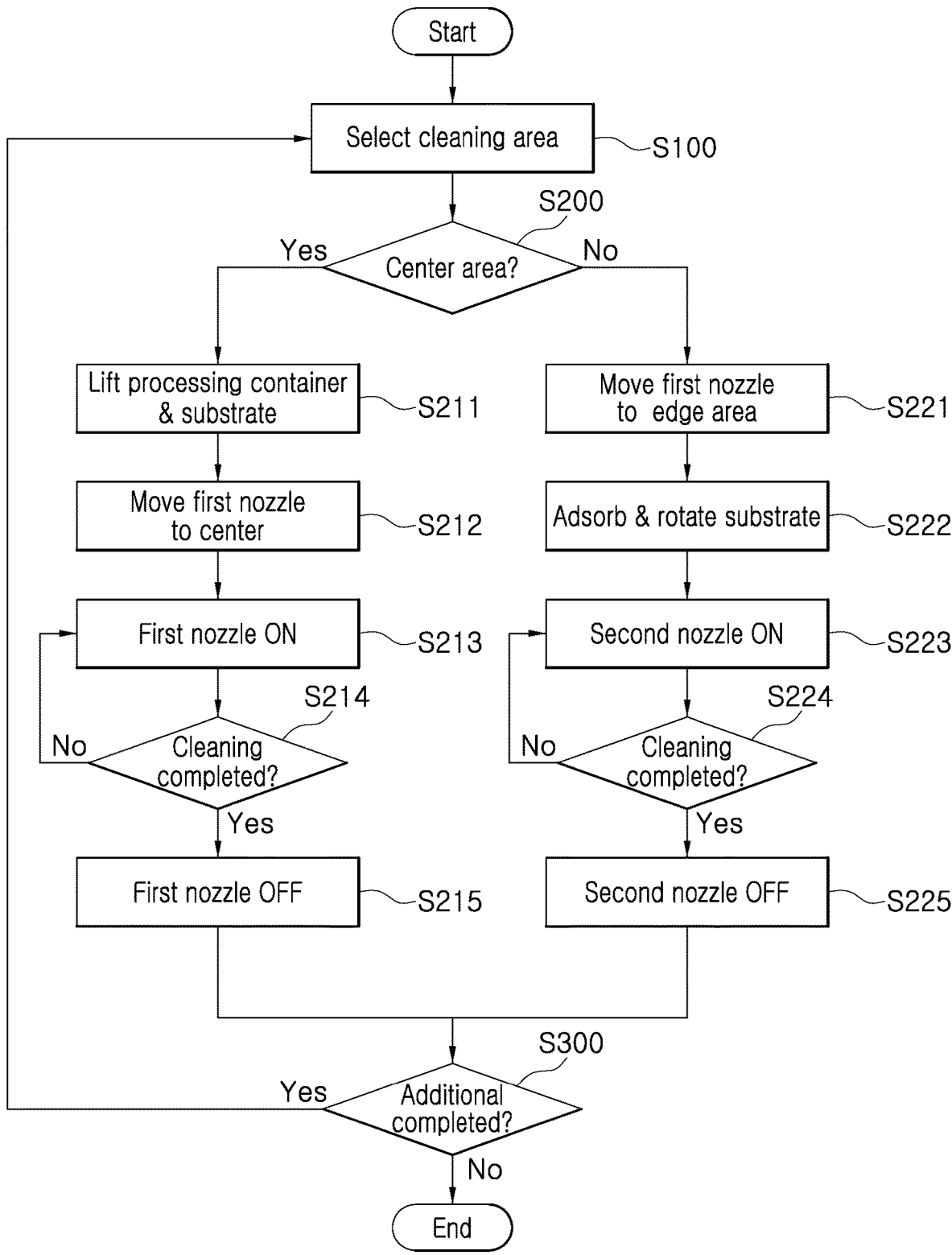

SUBSTRATE PROCESSING APPARATUS AND SUBSTRATE PROCESSING METHOD

CROSS REFERENCE TO RELATED APPLICATION

The present application claims priority to Korean Patent Application No. 10-2022-0165523, filed Dec. 1, 2022, the entire contents of which is incorporated herein for all purposes by this reference.

BACKGROUND OF THE INVENTION

1. Field of the Invention

The present disclosure relates to a substrate processing apparatus and a substrate processing method.

2. Description of the Related Art

In order to manufacture semiconductor devices, various processes such as photolithography, deposition, ashing, etching, and ion implantation are performed. Before and after these processes are performed, a cleaning process for removing particles remaining on the substrate is performed.

The cleaning process may be performed by supplying a cleaning liquid to both sides of a substrate supported by a spin head. For example, the top surface of the substrate may be cleaned with a processing fluid supplied by an upper fluid supply unit provided above a support member supporting the substrate, and the bottom surface of the substrate may be cleaned with a processing fluid supplied from a lower fluid supply unit provided between the substrate and the support member supporting the substrate.

Conventional substrate bottom surface cleaning is divided into cleaning of the center area and cleaning of the edge area. To be specific, the cleaning of the center area may be performed by supplying a cleaning fluid toward the substrate from a center cleaning nozzle provided under the substrate while the substrate moves in the horizontal direction within a cleaning space, and the cleaning of the edge area may be performed by supplying a cleaning fluid toward the substrate from an edge center nozzle provided under the substrate while the substrate rotates while seated on the substrate support member.

That is, a substrate that has passed over the top of the substrate support member for substrate bottom center cleaning needs to be returned onto the substrate support member for substrate bottom edge cleaning, and there is a possibility of recontamination of the center area that has already been cleaned and dried during substrate bottom edge cleaning. In order to prevent this, a technology of forming an air curtain and protecting the center area of the bottom surface of a substrate is applied. However, this technique requires a huge amount of gas and is the main cause of deteriorating exhaust performance.

Moreover, since the position of a substrate is not fixed but moving when cleaning the center area, there may be problems with cleaning uniformity, and reverse contamination by liquid particles floating in the cleaning space is likely to occur.

SUMMARY OF THE INVENTION

Accordingly, the present disclosure has been made keeping in mind the above problems occurring in the related art, and the present disclosure is intended to provide a substrate processing apparatus and a substrate processing method for performing both center cleaning and edge cleaning of the bottom surface of a substrate while the position of the substrate is fixed.

In addition, an objective of the present disclosure is to provide a substrate processing apparatus and a substrate processing method, which are advantageous to particle control.

In addition, an objective of the present disclosure is to provide a substrate processing apparatus and a substrate processing method for improving cleaning efficiency and reducing the apparatus footprint.

Objectives of the present disclosure are not limited thereto, and other objectives not mentioned will be clearly understood by those skilled in the art from the following description and accompanying drawings.

In order to achieve the above objective, according to an embodiment of the present disclosure, there is provided a substrate processing apparatus including: a processing container configured to form a processing space for a substrate; a substrate support unit provided inside the processing space and configured to support the substrate; a first nozzle unit configured to have a first nozzle member provided on a side of the substrate support unit inside the processing space and supplying a processing fluid toward a center area of a bottom surface of the substrate; and a second nozzle member provided to be fixedly coupled to the substrate support unit and supplying a processing fluid toward an edge area of the bottom surface of the substrate. The first nozzle member may be provided to rotate between a center position and an end position of the bottom surface of the substrate.

According to an embodiment of the present disclosure, there may be provided a substrate processing method including: center cleaning to supply a processing fluid to a center area of a bottom surface of a substrate; and edge cleaning to supply a processing fluid to an edge area of the bottom surface of the substrate. The center cleaning may be performed by a first nozzle member provided to be rotatably movable on a side of a substrate support unit for supporting a substrate, and the edge cleaning may be performed by a second nozzle member provided to be fixedly coupled to the substrate support unit. The first nozzle member may rotate between the center area and the edge area of the substrate under the substrate with a support arm supporting the first nozzle member serving as a central axis.

According to an embodiment of the present disclosure, there may be provided substrate processing equipment, including: a load port where a carrier containing the substrate is seated; an index frame with an index robot provided therein, the index robot being provided to transport the substrate from the carrier seated in the load port; and a process processing module configured to include a substrate processing apparatus that performs a liquid treatment process on the substrate. The substrate processing apparatus may include: a processing container configured to form a processing space for a substrate; a substrate support unit provided inside the processing space and configured to support and rotate the substrate; an upper fluid supply unit configured to supply a processing fluid to a top surface of the substrate; and a lower fluid supply unit configured to supply a processing fluid to a bottom surface of the substrate. The lower fluid supply unit may include: a first nozzle unit configured to have a first nozzle member provided on a side of the substrate support unit inside the processing space and supplying a processing fluid toward a center area of the bottom surface of the substrate; and a second nozzle member provided to be fixedly coupled to the substrate support unit and supplying a processing fluid toward an edge area of the bottom surface of the substrate. In this case, the first nozzle member may be provided to rotate between a center position and an end position of the bottom surface of the substrate.

In the substrate processing equipment, when cleaning the center area of the bottom surface of the substrate, the substrate may be lifted from the substrate support unit by raising the processing container, the first nozzle member may be moved to a position corresponding to a center of the substrate under the substrate, and while the first nozzle member supplies a processing fluid toward the bottom surface of the substrate, the second nozzle member may be controlled not to supply a processing fluid, and when cleaning the edge area of the bottom surface of the substrate, the first nozzle member may be moved to a position corresponding to an end of the substrate under the substrate, the substrate may be seated on the substrate support unit, the substrate support unit may rotate the substrate in a state in which the substrate is adsorbed, and the second nozzle member may be controlled to supply a processing fluid toward the bottom surface of the substrate.

According to an embodiment of the present disclosure, since a processing container that surrounds a substrate to form a cleaning space for the substrate is provided to move the substrate up and down, a first nozzle for cleaning the center area of the bottom surface of the substrate is provided to be able to move up and down and rotate on one side of the cleaning space, and a second nozzle for cleaning the edge area of the bottom surface of the substrate is fixed to a substrate support unit that supports the substrate, both center cleaning and edge cleaning of the bottom surface of the substrate can be performed on a substrate support member. That is, since the cleaning process for the bottom surface of the substrate can be performed without moving the position of the substrate, it is advantageous for process and footprint optimization.

Furthermore, since the first nozzle rotatably provided may serve as a cover for the substrate support member and a gas supply unit supplying gas from below the substrate toward the substrate forms an air curtain, contamination of the substrate support unit can be prevented and the exhaust efficiency can be improved due to the position fixing of the processing container and the substrate, which is advantageous for particle control.

The effects of the present disclosure are not limited to the above effects, and effects not mentioned will be clearly understood by those skilled in the art from this specification and the accompanying drawings.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 12 is a flowchart showing a substrate processing method according to an embodiment of the present disclosure.

DETAILED DESCRIPTION OF THE INVENTION

Figure 1:
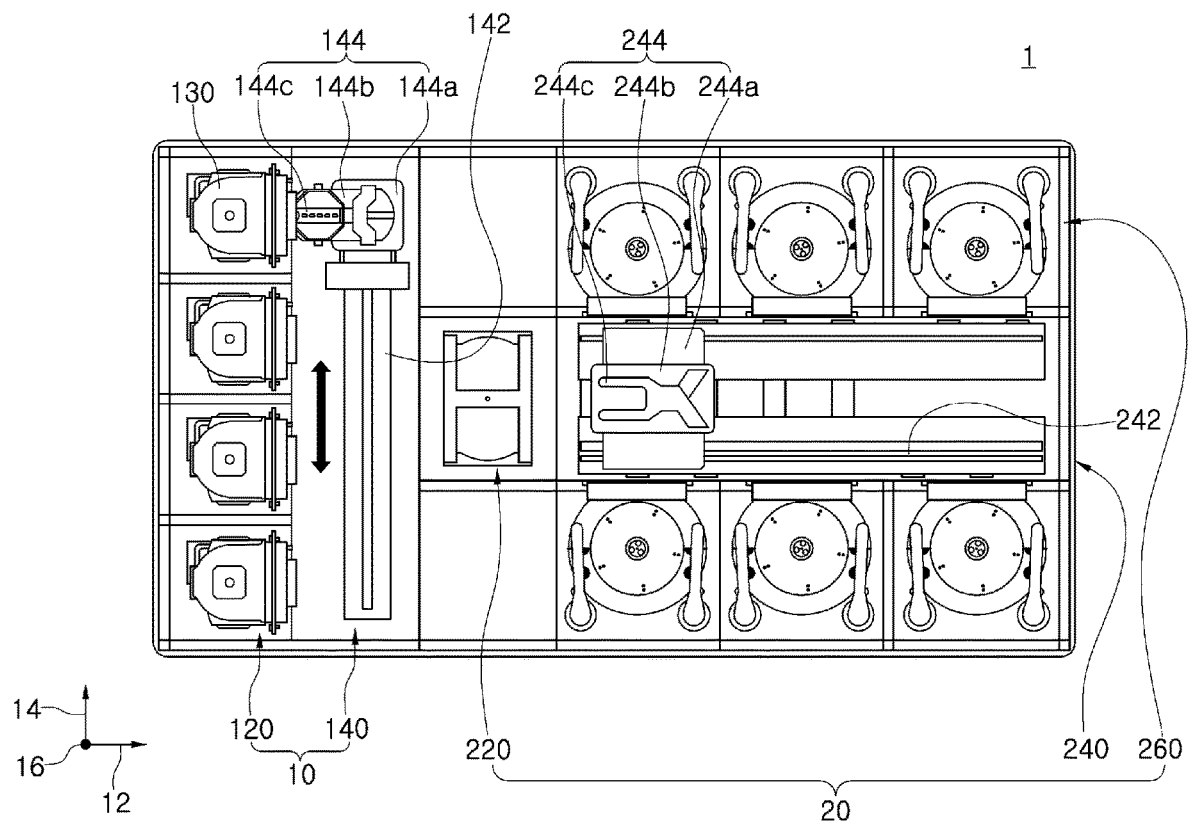
FIG. 1 is a plan view showing substrate processing equipment according to an embodiment of the present disclosure.

Hereinafter, embodiments of the present disclosure will be described in detail with reference to the accompanying drawings so that those skilled in the art can easily carry out the present disclosure. However, the present disclosure may be embodied in many different forms and is not limited to the embodiments described herein. For example, variations in manufacturing methods and/or tolerances, are fully expected. Therefore, the embodiments of the present disclosure are not to be described as being limited to specific shapes of regions illustrated as illustrations, but to include deviations in shape, and the components described in the drawings are purely schematic and their shape is not intended to illustrate the exact shape of the components nor is it intended to limit the scope of the present disclosure. In describing with reference to the accompanying drawings, regardless of the reference numerals, the same or corresponding components are given the same reference numerals, and duplicate descriptions thereof will be omitted.

In describing the embodiments of the present disclosure, when it is determined that a detailed description of a related known function or configuration may unnecessarily obscure the subject matter of the present disclosure, the specific description will be omitted, and parts with similar functions and actions will use the same reference numerals throughout the drawings.

Since at least some of the terms used in the specification are defined in consideration of functions in the present disclosure, they may vary according to user, operator intention, custom, and the like. Therefore, the terms should be interpreted based on the contents throughout the specification.

In addition, in this specification, the singular form also includes the plural form unless otherwise specified in the phrase. In the specification, when a certain component is said to be included, this means that other components may also be included without excluding other components unless otherwise stated. When a part is said to be connected (or coupled) with another part, this includes not only the case of being directly connected (or coupled), but also the case of being indirectly connected (or coupled) with another part in between.

Unless otherwise defined, all terms used herein, including technical or scientific terms, have the same meaning as commonly understood by a person skilled in the art. Terms such as those defined in the commonly used dictionaries should be construed as having meanings consistent with the meanings in the context of the related art and shall not be construed in ideal or excessively formal meanings unless expressly defined in this application.

Meanwhile, in the drawings, the size or shape of components, and thickness of lines may be somewhat exaggerated for convenience of understanding.

FIG. 1 is a plan view showing substrate processing equipment according to an embodiment of the present disclosure. Referring to FIG. 1, substrate processing equipment 1 to which the present disclosure is applied has an index module 10 and a process processing module 20. The index module 10 has a load port 120 and an index frame 140. The load port 120, the index frame 140, and the process processing module 20 are sequentially arranged in a line.

Hereinafter, a direction in which the load port 120, the index frame 140, and the process processing module 20 are arranged is defined as a first direction 12, a direction perpendicular to the first direction 12 is defined as a second direction 14 when viewed from above, and a direction perpendicular to the plane including both the first direction 12 and the second direction 14 is defined as a third direction 16.

A carrier 130 containing the substrate W is seated in the load port 120. A plurality of load ports 120 may be provided, and the plurality of load ports 120 may be arranged in a line along the second direction 4. The number of load ports 120 may increase or decrease depending on process efficiency and footprint conditions of the process processing module 20. The carrier 130 is formed with a plurality of slots (not shown) for accommodating substrates W in a state in which the substrates W are arranged horizontally with respect to the ground. As the carrier 130, a front opening unified pod (FOUP) may be used.

The process processing module 20 may include a buffer unit 220, transfer chamber 240, and process unit 260. The transfer chamber 240 may be disposed parallel to the first direction 12 in its longitudinal direction. The process unit 260 may be disposed in plurality on both sides of the transfer chamber 240. As an example, at one side and the other side of the transfer chamber 240, the process units 260 may be provided symmetrically with respect to the transfer chamber 240. A plurality of process units 260 may be provided on one side of the transfer chamber 240. Some of the process units 260 are disposed along the length direction of the transfer chamber 240. In addition, some of the process units 260 are arranged stacked on top of each other. As an example, on one side of the transfer chamber 240, the process units 260 may be arranged in an A×B arrangement. In this case, A is the number of process units 260 provided in a line along the first direction 12, and B is the number of process units 260 provided in a line along the third direction 16. When four or six process units 260 are provided on one side of the transfer chamber 240, the process units 260 may be arranged in a 2×2 or 3×2 arrangement. The number of process units 260 may be increased or decreased. Unlike the above, the process unit 260 may be provided on only one side of the transfer chamber 240. The process unit 260 may be provided as a single layer on one side or both sides of the transfer chamber 240.

The buffer unit 220 is disposed between the index frame 140 and the transfer chamber 240. The buffer unit 220 provides a space where the substrate W stays before being transported between the transfer chamber 240 and the index frame 140. A slot (not shown) in which the substrate W is placed may be provided inside the buffer unit 220. A plurality of slots (not shown) may be provided to be spaced apart from each other along the third direction 16. A surface of the buffer unit 220 facing the index frame 140 and a surface of the buffer unit 220 facing the transfer chamber 240 may be open.

The index frame 140 may transport the substrate W between the carrier 130 seated on the load port 120 and the buffer unit 220. An index rail 142 and an index robot 144 may be provided on the index frame 140. The length direction of the index rail 142 is parallel to the second direction 14. The index robot 144 is installed on the index rail 142 and linearly moves in the second direction 14 along the index rail 142. The index robot 144 may have a base 144a, a body 144b, and an index arm 144c. The base 144a may be installed to be movable along the index rail 142. The body 144b is coupled to the base 144a, and the body 144b may be provided to be movable along the third direction 16 on the base 144a. In addition, the body 144b may be provided to be rotatable on the base 144a. The index arm 144c may be coupled to the body 144b and may move forward and backward with respect to the body 144b. A plurality of index arms 144c may be provided to be individually driven. The index arms 144c may be stacked and spaced apart from each other along the third direction 16. Some of the index arms 144c may be used to transport the substrate W from the process processing module 20 to the carrier 130, while other index arms 144c may be used to transport the substrate W from the carrier 130 to the process processing module 20. This may be to prevent particles generated from the substrate W before the process processing from being attached to the substrate W after the process processing in the process of the index robot 144 carrying in and out the substrate W.

The transfer chamber 240 may transport the substrate W between the buffer unit 220 and the process unit 260 and between the process units 260. A guide rail 242 and a main robot 244 may be provided in the transfer chamber 240. The guide rail 242 is disposed such that its longitudinal direction is parallel to the first direction 12. The main robot 244 is installed on the guide rail 242 and moves linearly along the first direction 12 on the guide rail 242. The main robot 244 may have a base 244a, a body 244b, and a main arm 244c. The base 244a may be installed to be movable along the guide rail 242. The body 244b is coupled to the base 244a, and the body 244b may be provided to be movable along the third direction 16 on the base 244a. In addition, the body 244b may be provided to be rotatable on the base 244a. The main arm 244c is coupled to the body 244b, and may be provided to move forward and backward with respect to the body 244b. A plurality of main arms 244c may be provided to be individually driven. The main arms 244c may be stacked and spaced apart from each other along the third direction 16.

The process unit 260 may perform a treatment process on the substrate. The processing unit 260 may include a substrate processing apparatus 300 for performing a liquid treatment process for the substrate W by supplying a processing liquid to the substrate W. As an embodiment to which the present disclosure is applied, a substrate processing apparatus that performs a cleaning process by supplying a cleaning liquid to the substrate W will be described as an example. The substrate processing apparatus 300 included in the process unit 260 may have a different structure depending on the type of cleaning process to be performed. Unlike this, the substrate processing apparatus 300 included in each process unit 260 may have the same structure. Alternatively, the process units 260 are divided into a plurality of groups, and the substrate processing apparatuses 300 provided to the process units 260 belonging to the same group may be provided identically to each other, while the structures of the substrate processing apparatuses 300 provided to process units 260 belonging to different groups may be provided differently from each other.

Figure 2:
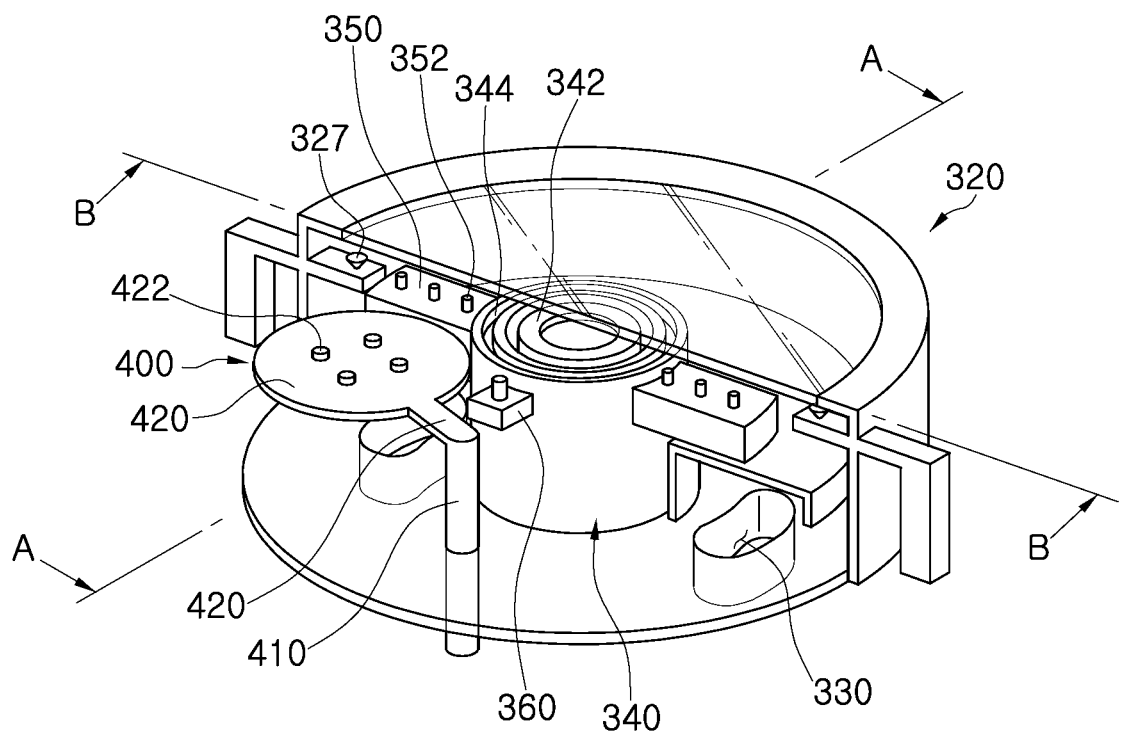
FIGS. 2 and 3 are perspective views showing a substrate processing apparatus according to an embodiment of the present disclosure.
Figure 3:
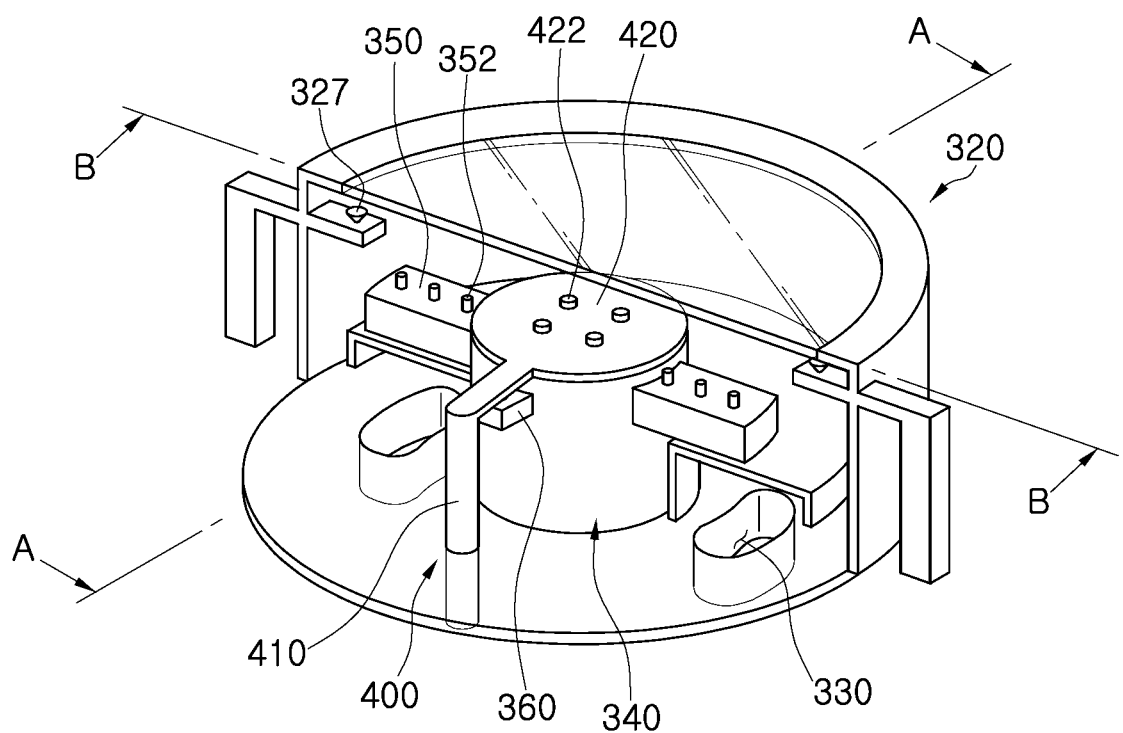

FIGS. 2 and 3 are cross-sectional views schematically showing an embodiment of the substrate processing apparatus 300 provided in the process unit 260 of FIG. 1. The substrate processing apparatus 300 treats the substrate W with liquid. In this embodiment, the substrate liquid treatment process is described as a cleaning process. However, this is not intended to limit the liquid treatment process to which the present disclosure is applied to the cleaning process, and the present disclosure is applicable to various liquid treatment processes such as photolithography, ashing, and etching. The substrate processing apparatus 300 may include a lower fluid supply unit for treating the bottom surface (lower surface) of the substrate W. The lower fluid supply unit may clean and dry the bottom surface of the substrate W. The lower fluid supply unit may supply a processing fluid including a processing liquid to the bottom surface of the substrate W. The bottom surface of the substrate W may be a non-patterned surface opposite to a surface on which patterns are formed. The lower fluid supply unit may supply the processing fluid simultaneously with an upper fluid supply unit.

Although not shown in detail, the upper fluid supply unit for treating the top surface of the substrate W may be provided in the upper part of the substrate processing apparatus 300 shown in FIGS. 2 and 3. The upper fluid supply unit may treat the top surface of the substrate by supplying a processing fluid to the top surface of the substrate.

Referring to FIGS. 2 and 3, the substrate processing apparatus 300 includes a processing container 320, an exhaust unit 330, a substrate support unit 340 to which a second nozzle member 350 is mounted, and a first nozzle unit 400.

The processing container 320 may provide a processing space therein where a treatment process for a substrate is performed. The processing container 320 may have an open structure surrounding the substrate support unit 340. For example, the processing container 320 may have a cylindrical shape with an open top. The processing container 320 may prevent the processing liquid supplied to the substrate W from scattering to the surroundings during the process. The processing container 320 includes an upper container 322 and a lower container 324, and the upper container 322 may be provided to be liftable from the lower container 324. The upper container 322 may include a side chuck 327 for supporting the substrate W. The side chuck 327 may support the edge area of the bottom surface of the substrate W and support the substrate W in a vacuum suction method. Due to the side chuck 327, when the upper container 322 is raised, the substrate W may be raised together.

Although not shown in detail, upper container 322 may be connected to a lifting unit for lifting the upper container 322. For example, the lifting unit (not shown) may linearly move the upper container 322 in an up and down direction. As the upper container 322 moves up and down, the relative heights of the upper container 322 and the substrate W with respect to the substrate support unit 340 may change. As an example, the lifting unit may have a bracket, a moving shaft, and an actuator. The bracket is fixedly installed on the outer wall of the upper container, and the moving shaft moving in the vertical direction by the actuator may be fixedly coupled to the bracket.

As an example, the upper container 322 may be raised to place the substrate W on top of the substrate support unit 340 in order to clean the center area of the bottom surface of the substrate W, and the upper container 322 may be lowered so that the substrate W may be seated on the substrate support unit 340 in order to clean the bottom edge area of the substrate W after the cleaning of the center area has been completed. Meanwhile, the processing container 320 may include an exhaust unit 330 at a lower portion thereof.

The exhaust unit 330 may include an exhaust port, an exhaust line, and an exhaust pump. The exhaust unit 330 may evacuate the inside of the processing container 320, that is, the inside of the processing space, by means of the exhaust port and the exhaust line. The exhaust unit 330 may discharge the processing fluid used in the cleaning process and particles removed from the substrate W by the processing fluid to the outside of the processing space through the exhaust port and the exhaust line. At this time, the processing space may be decompressed to a predetermined pressure by an exhaust pump.

The substrate support unit 340 is provided inside the processing space to support the substrate W. The substrate support unit 340 may support the substrate W and rotate the substrate W during the process. As an example, the substrate support unit 340 may include a spin head. The substrate support unit 340 may have a substrate support member 342, a rotation drive member, and a gas supply unit 344.

The substrate support member 342 is provided in a substantially circular plate shape and has an upper surface and a lower surface. The lower surface may have a smaller diameter than the upper surface. The upper and lower surfaces are positioned such that the central axes thereof coincide with each other. The shape and dimensions of the substrate support member 342 may vary according to the shape and dimensions of the substrate W. Although not shown in detail, the substrate support member 342 may include a support pin and a chuck pin. As an example, the substrate support member 342 may include a plurality of support pins and a plurality of chuck pins to more stably support the substrate. The plurality of support pins may contact a bottom surface of the substrate, and the plurality of chuck pins may contact a side surface of the substrate. The support pins may support the substrate and the chuck pins may maintain a position of the substrate while a treatment process is performed on the substrate in the processing space.

The rotation drive member rotates the substrate support member 342. The substrate support member 342 is rotatable about a central axis by the rotation drive member. The rotation drive member may include a support shaft and a drive part, and the support shaft may have a cylindrical shape having a height along the third direction 16. An upper end of the support shaft may be fixedly coupled to the center of the bottom surface of the substrate support member 342. The drive part provides a driving force so that the support shaft rotates. The drive part may rotate a substrate placed on the substrate support member 342 by rotating the support shaft connected to a lower portion of the substrate support member 342.

The gas supply unit 344 may supply a predetermined gas to the bottom surface of the substrate W. As an example, the gas supply unit 344 may supply an inert gas such as nitrogen (N2) toward the bottom surface of the substrate W. Alternatively, air such as CDA (Clean Dry Air) may be supplied. The gas supply unit 344 may be provided in a tubular shape surrounding the substrate support member 342. The gas supply unit 344 may be configured to receive gas from a gas supply source.

As an example, the gas supply unit 344 may form an air curtain by supplying gas in a direction substantially orthogonal to the bottom surface of the substrate W. The gas supply unit 344 may prevent particles floating in the processing space from being reattached to the center area of the bottom surface of the substrate W by forming an air curtain. As an example, the gas supply unit 344 may remove processing liquid (e.g., cleaning liquid) that may remain on the lower surface of the substrate W. Optionally, the gas supply unit 344 may be used in a process of drying the substrate W after a cleaning process is performed on the substrate W. The gas supply unit 344 may be provided in the form of an air knife. Meanwhile, in order to prevent foreign substances from being introduced into the substrate support member 342, gas supply by the gas supply unit 344 may be continuously performed while the substrate cleaning process is performed. That is, the gas supply unit 344 may be maintained in an ON state throughout the substrate cleaning process.

The second nozzle member 350 supplies the processing fluid toward the edge area of the bottom surface of the substrate W and may be provided in a form fixedly coupled to the substrate support unit 340. To be specific, the second nozzle member 350 is fixedly coupled to the outer wall of the substrate support unit 340 and has a shape protruding from the substrate support unit 340 toward the processing container 320. That is, the second nozzle member 350 has a shape having a length in a direction from the center of the processing container 320 toward the outer side.

The second nozzle member 350 may include a plurality of second nozzles 352. The second nozzles 352 may be arranged in a line with a predetermined interval along a direction from the outer wall of the substrate support unit 340 toward the processing container 320. Each of the second nozzles 352 may supply the processing fluid onto the bottom surface of the substrate W supported by the substrate support unit 340. That is, the individual second nozzles 352 may supply at least one of a cleaning liquid and a drying gas onto the bottom edge area of the substrate W. For example, the cleaning liquid may include a chemical solution or deionized water. The drying gas may include an inert gas such as nitrogen or CDA. As an example, some of the plurality of second nozzles 352 may spray deionized water onto the bottom surface of the substrate W, some may spray chemical solution onto the bottom surface of the substrate W, and some may spray drying gas onto the bottom surface of the substrate W. Alternatively, all of the second nozzles 352 may selectively spray the chemical solution, deionized water, and drying gas onto the bottom surface of the substrate W. Although not shown in detail, each of the plurality of second nozzles 352 may be connected to a processing fluid supply source through a pipe. In addition, the flow rate of the processing fluid discharged from each of the second nozzles 352 may be individually controlled.

The supply of the processing fluid by the second nozzle member 350 may be performed only when cleaning the edge area of the bottom surface of the substrate W. That is, the supply of the processing fluid by the second nozzle member 350 may be blocked when cleaning the center area of the bottom surface of the substrate W.

An auxiliary nozzle 360 may be further coupled to the substrate support unit 340. The auxiliary nozzle 360 is used together with the second nozzle member 350 to clean the edge area of the bottom surface of the substrate W and may have the same configuration as the second nozzle member 350. The auxiliary nozzle may include fewer nozzles than the second nozzle member 350. The auxiliary nozzle 360 may be omitted. However, by further mounting the auxiliary nozzle 360 on the substrate support unit 340, the supply efficiency of the processing fluid to the edge area of the bottom surface of the substrate W may be increased.

The first nozzle unit 400 is provided on one side of the substrate support unit 340 inside the processing space and includes a first nozzle member 420 and a support arm 410 supporting the first nozzle member 420.

The support arm 410 has a height in the same direction as the substrate support unit 340 at one side of the substrate support unit 340, and the upper end of the support arm 410 is coupled to the bottom surface of the first nozzle member 420. As an example, the upper end of the support arm 410 may be fixedly coupled to one side of the bottom surface of the first nozzle member 420. The support arm 410 may be provided to be movable up and down and rotatable by a separate drive member. Accordingly, the first nozzle member 420 may be moved up and down and rotated.

The first nozzle member 420 may be provided to supply the processing fluid toward the center area of the bottom surface of the substrate W, and to rotate and move up and down by the support arm 410. To be specific, the first nozzle member 420 may be provided to rotate between a position corresponding to the center of the substrate W and a position corresponding to the end of the substrate W under the substrate W.

As an example, when the upper container 322 is lifted to place the substrate W on top of the substrate support unit 340 in order to clean the center area of the bottom surface of the substrate W, the first nozzle member 420 is raised and rotated to a position corresponding to the center of the substrate W, and when the cleaning of the center area is completed, the first nozzle member 420 may be rotated to a position corresponding to the end of the substrate W and then lowered.

Since the first nozzle member 420 is movable in the space between the substrate support unit 340 and the substrate W through rotational motion, the first nozzle member 420 may serve as a cover for the substrate support unit 340. Thus, the first nozzle member 420 may have a size larger than or equal to the upper surface of the substrate support unit 340 to prevent foreign substances from entering the substrate support unit 340. In addition, the first nozzle member 420 may be provided in a circular plate shape.

The first nozzle member 420 may include a plurality of first nozzles 422. As an example, the first nozzles 422 may be disposed along the circumference of the first nozzle member 420 provided in a circular plate shape. Alternatively, the first nozzles 422 may be disposed in the center area and the edge area of the first nozzle member 420 (see FIGS. 10 and 11).

Each of the first nozzles 422 may supply a processing fluid toward the bottom surface of the substrate W supported by the side chuck 327. That is, the individual first nozzles 422 may supply at least one of a cleaning liquid and a drying gas onto the center area of the bottom surface of the substrate W raised by the upper container 322. For example, the cleaning liquid may include a chemical solution or deionized water. The drying gas may include an inert gas such as nitrogen or CDA.

As an example, some of the plurality of first nozzles 422 may spray deionized water onto the bottom surface of the substrate W, some may spray chemical solution onto the bottom surface of the substrate W, and some may spray drying gas onto the bottom surface of the substrate W. When the first nozzles 422 are divided and disposed in two places, the edge area and the center area, some of the first nozzles 422 in the edge area may spray deionized water onto the bottom surface of the substrate W while the rest of the first nozzles 422 in the edge area may spray the chemical solution onto the bottom surface of the substrate W, and the first nozzles 422 in the center area may spray the dry gas onto the bottom surface of the substrate W. Alternatively, all of the first nozzles 422 may selectively spray the chemical solution, deionized water, and drying gas onto the bottom surface of the substrate W.

Although not shown in detail, each of the plurality of first nozzles 422 may be connected to a processing fluid supply source through a pipe. In addition, the flow rate of the processing fluid discharged from each of the first nozzles 422 may be individually controlled. For example, the flow rate of the processing fluid discharged from each of the first nozzles 422 may be controlled for each area. As an example, a discharge flow rate of nozzles disposed in the center area and a discharge flow rate of nozzles disposed in the edge area may be controlled differently.

The supply of the processing fluid by the first nozzle member 420 may be made only when cleaning the center area of the bottom surface of the substrate W is performed. That is, the supply of the processing fluid by the first nozzle member 420 may be blocked when cleaning the edge area of the bottom surface of the substrate W is performed. Optionally, the supply of the processing fluid by the first nozzle member 420 may be allowed when cleaning the edge area of the bottom surface of the substrate W is performed.

Figure 4:
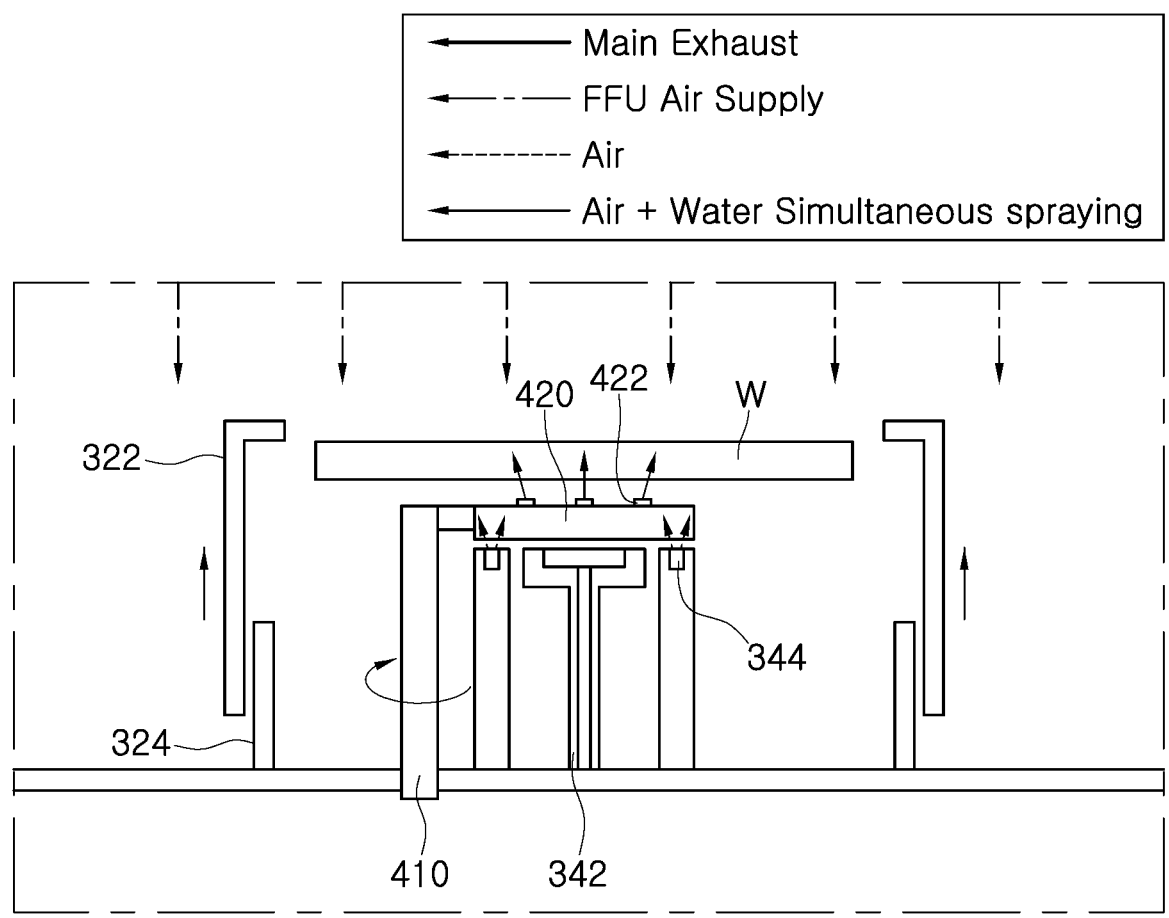
FIGS. 4 to 9 are schematic side views showing an operation example of the substrate processing apparatus according to the embodiment of the present disclosure.
Figure 5:
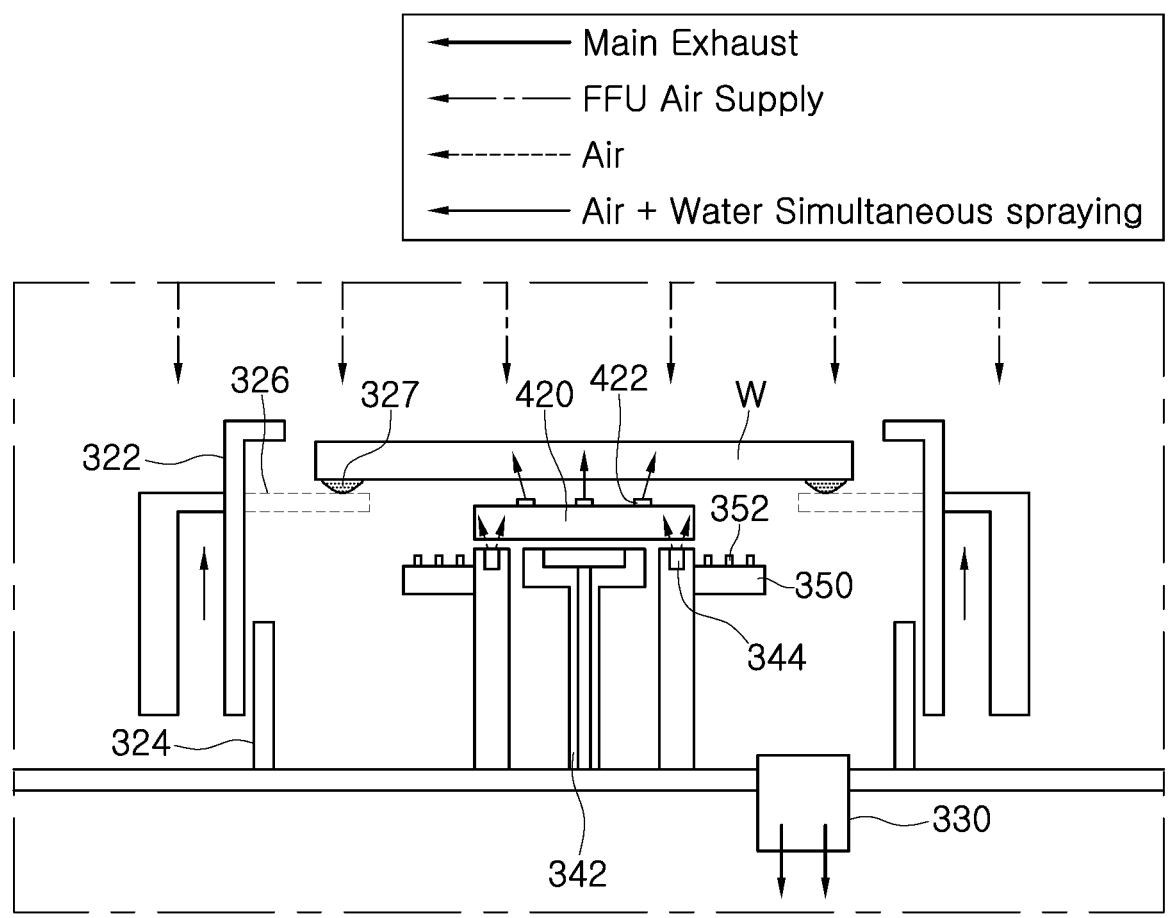
Figure 6:
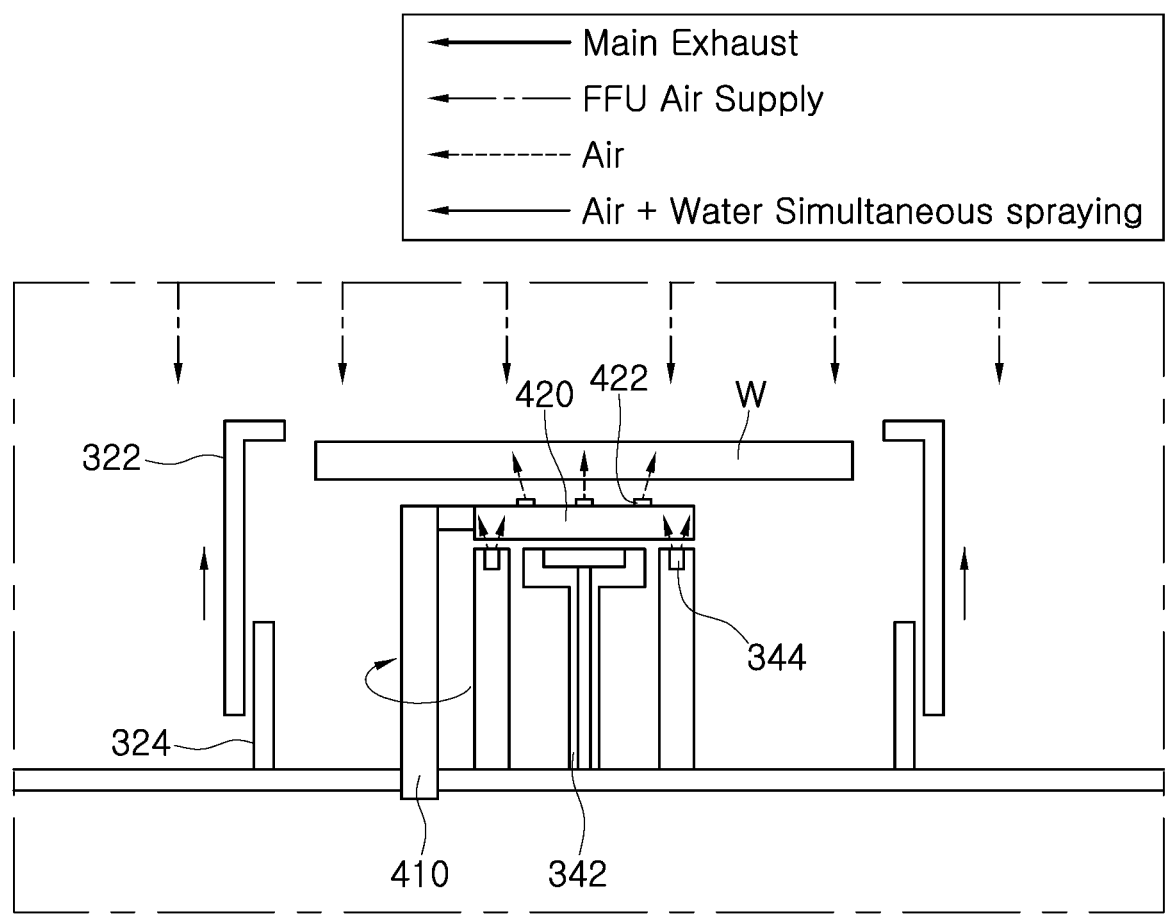
Figure 7:
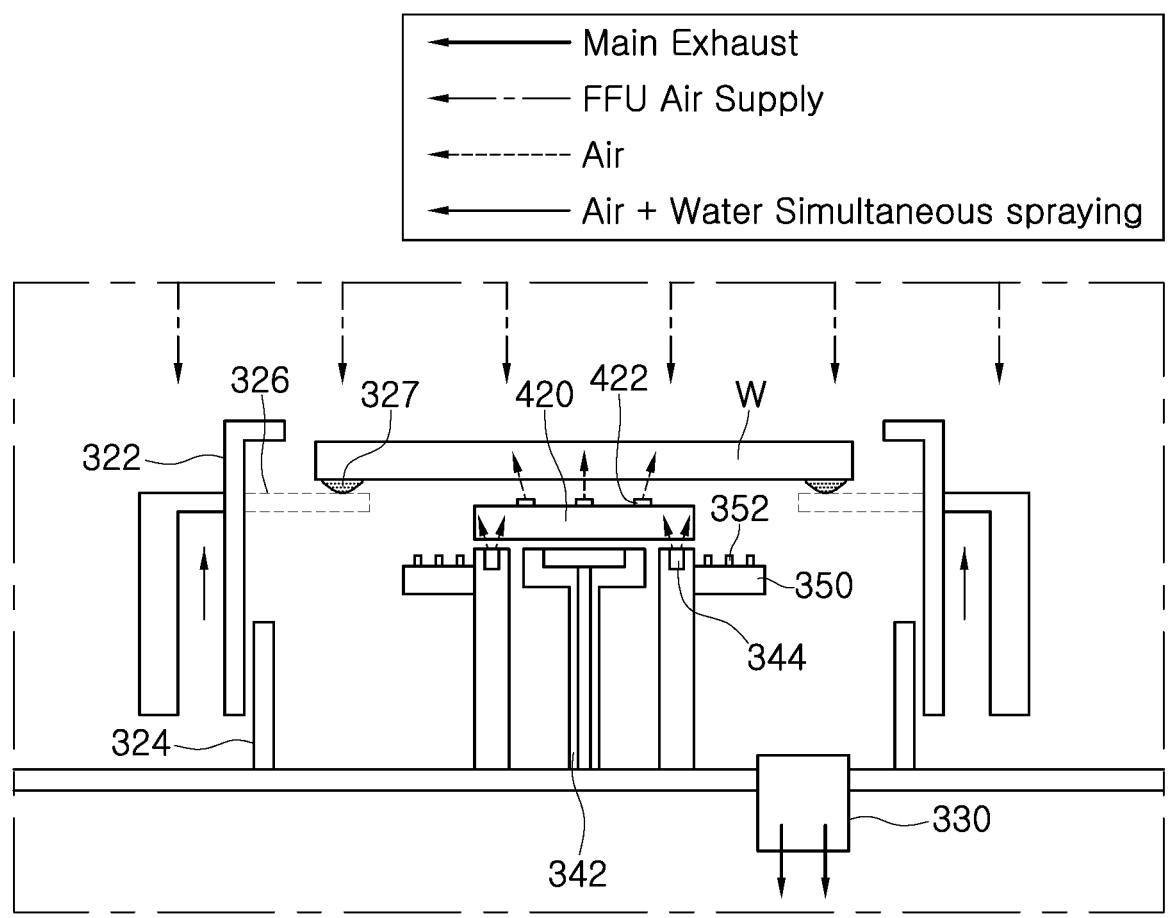
Figure 8:
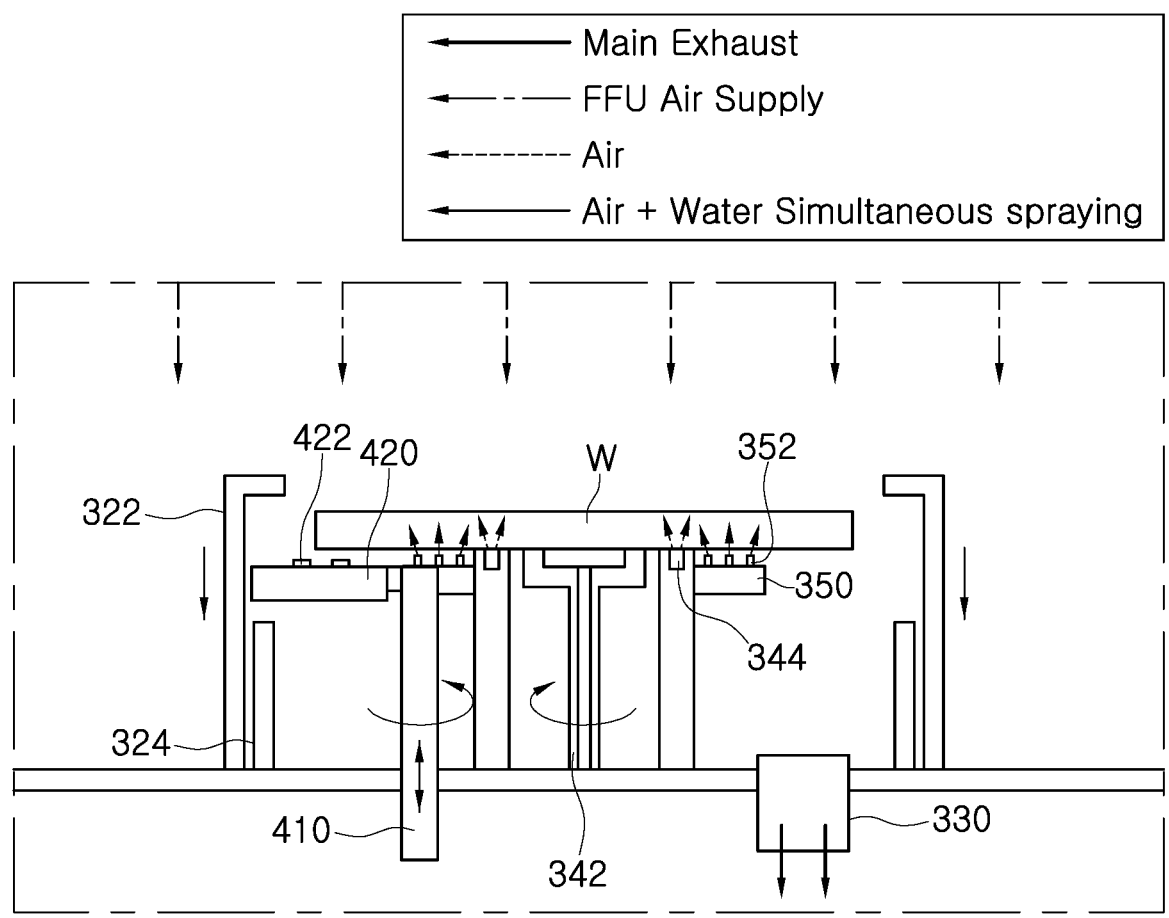
Figure 9:
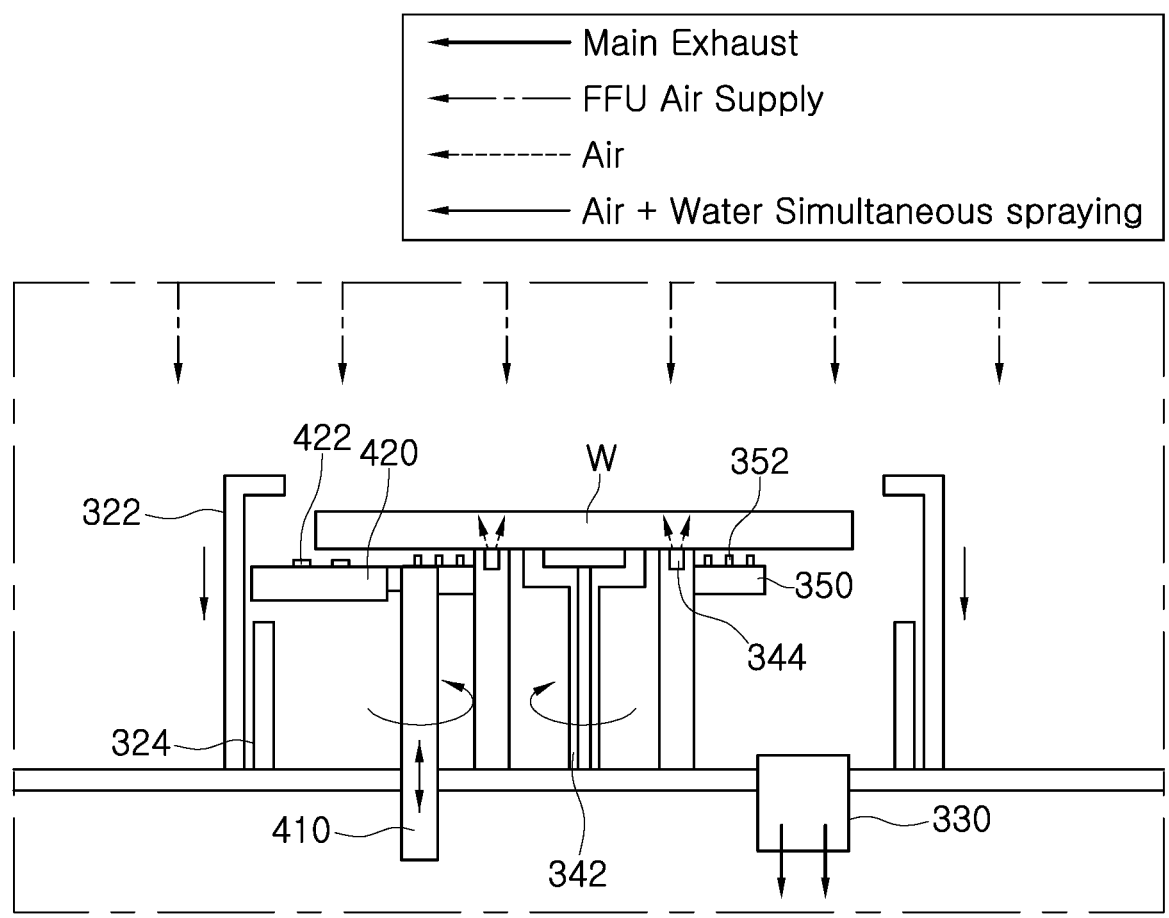

Hereinafter, with reference to FIGS. 4 to 9, an embodiment of a substrate processing method of cleaning a bottom surface of a substrate using the substrate processing apparatus shown in FIGS. 2 and 3 will be described. FIGS. 4 and 5 are side views showing a process of cleaning the center area on the bottom surface of the substrate; FIGS. 6 and 7 are side views showing a process of drying the center area on the bottom surface of the substrate; FIG. 8 is a side view showing a process of cleaning the edge area on the bottom surface of the substrate; and FIG. 9 is a side view showing a process of drying the edge area on the bottom surface of the substrate.

The substrate processing method according to an embodiment of the present disclosure includes a method of cleaning the bottom surface of the substrate, and may include: center cleaning to clean the center area of the bottom surface of the substrate by supplying a processing fluid to the center area of the bottom surface of the substrate; and edge cleaning to clean the edge area of the bottom surface of the substrate by supplying a processing fluid to the edge area of the bottom surface of the substrate. In the cleaning process of the bottom surface of the substrate, it is common that the center cleaning step is performed first and then the edge cleaning step is performed, but the edge cleaning step may be performed before the center cleaning step depending on the design. According to an embodiment of the present disclosure, the center cleaning step may be performed by the first nozzle member 420 provided to be rotatably movable on one side of the substrate support unit 340, and the edge cleaning step may be performed by the second nozzle member 350 fixedly coupled to the outer wall of the substrate support unit 340.

The center cleaning step may include cleaning the center area of the bottom surface of the substrate W and drying the center area of the bottom surface of the substrate W.

FIGS. 4 and 5 show a process in which the first nozzle member 420 cleans the center area of the bottom surface of the substrate W. FIG. 4 is a side view of FIG. 3 viewed from the A-A direction, and FIG. 5 is a side view of FIG. 3 viewed from the B-B direction.

In order to clean the center area of the substrate W, the substrate W is lifted from the substrate support member 342 by lifting the upper container 322 from the lower container 324, and the first nozzle member 420 may be rotated and controlled to be positioned in a region between the substrate W and the substrate support member 342, that is, a location corresponding to the center of the substrate W under the substrate W.

The first nozzle member 420 located below the center area of the substrate W may be controlled to supply the processing fluid toward the bottom surface of the substrate W. That is, the plurality of first nozzles 422 may supply at least one of a cleaning liquid and a drying gas toward the center area of the bottom surface of the substrate W raised by the upper container 322. For example, the cleaning liquid may include a chemical solution or deionized water. The drying gas may include an inert gas such as nitrogen or CDA. As an example, some of the plurality of first nozzles 422 may spray deionized water onto the bottom surface of the substrate W, some may spray chemical solution onto the bottom surface of the substrate W, and some may spray drying gas onto the bottom surface of the substrate W. Alternatively, all of the first nozzles 422 may selectively spray the chemical solution, deionized water, and drying gas onto the bottom surface of the substrate W. While the processing fluid is supplied from the first nozzle member 420, the second nozzle member 350 may be controlled not to supply any processing fluid. That is, the supply of processing fluid by the second nozzle member 350 may be completely blocked.

Meanwhile, in order to prevent the processing fluid and particles present in the processing space from entering the substrate support unit 340, the gas supply unit 344 located below the first nozzle member 420 may form an air curtain by supplying gas in a direction substantially orthogonal to the bottom surface of the first nozzle member 420 while cleaning the center area of the bottom surface of the substrate W is being performed. The gas supplied by the gas supply unit 344 may include an inert gas such as nitrogen or CDA.

In addition, as the exhaust process by the exhaust unit 330 is simultaneously performed while the cleaning process is performed on the center area of the bottom surface of the substrate W, foreign substances and cleaning liquid detached from the bottom surface of the substrate W may be discharged from the processing space through the exhaust unit 330 as soon as they are detached from the bottom surface of the substrate W without floating in the processing space for a long time.

FIGS. 6 and 7 show a process in which the first nozzle member 420 dries the center area of the bottom surface of the substrate W after the cleaning process has been completed. FIG. 6 is a side view of FIG. 3 viewed from the A-A direction, and FIG. 7 is a side view of FIG. 3 viewed from the B-B direction.

The first nozzle member 420 still positioned below the center area of the substrate W may be controlled to supply only the drying gas to the bottom surface of the substrate W without supplying the cleaning liquid. The plurality of first nozzles 422 may supply only drying gas toward the bottom surface of the substrate W in a state raised by the upper container 322. The drying gas may include an inert gas such as nitrogen or CDA. While the processing fluid is supplied from the first nozzle member 420, the second nozzle member 350 may be controlled not to supply any processing fluid. That is, the supply of processing fluid by the second nozzle member 350 may be completely blocked.

Meanwhile, in order to prevent particles and cleaning liquid removed from the bottom of the substrate W present in the processing space from entering the substrate support unit 340, the gas supply unit 344 located below the first nozzle member 420 may form an air curtain by supplying gas in a direction substantially orthogonal to the bottom surface of the first nozzle member 420 while drying the center area of the bottom surface of the substrate W is being performed. The gas supplied by the gas supply unit 344 may include an inert gas such as nitrogen or CDA.

In addition, as the exhaust process by the exhaust unit 330 is simultaneously performed while the drying process is performed on the center area of the bottom surface of the substrate W, foreign substances and cleaning liquid detached from the bottom surface of the substrate W may be discharged from the processing space through the exhaust unit 330 as soon as they are detached from the bottom surface of the substrate W without floating in the processing space for a long time.

The edge cleaning step may include a process of cleaning the edge area of the bottom surface of the substrate W and a process of drying the edge area of the bottom surface of the substrate W.

FIG. 8 shows a process in which the second nozzle member 350 cleans the edge area of the bottom surface of the substrate W. FIG. 8 is a side view of FIG. 2 viewed from the A-A direction.

In order to clean the edge area of the substrate W, the first nozzle member 420 is rotated to return to a location corresponding to the edge area (end) of the substrate W and then descends, and the upper container 322 descends towards lower container 324, so that the substrate W may be controlled to be seated back onto the substrate support member 342. When the substrate W is placed on the substrate support member 342, the substrate support member 342 may be controlled to rotate after adsorbing and fixing the substrate W, and the second nozzle member 350 positioned below the edge area of the substrate W may be controlled to supply the processing fluid toward the bottom surface of the substrate W.

That is, the plurality of second nozzles 352 may supply at least one of a cleaning liquid and a drying gas toward the bottom surface of the rotating substrate W supported by the substrate support unit 340. For example, the cleaning liquid may include a chemical solution or deionized water. The drying gas may include an inert gas such as nitrogen or CDA. As an example, some of the plurality of second nozzles 352 may spray deionized water onto the bottom surface of the substrate W, some may spray chemical solution onto the bottom surface of the substrate W, and some may spray drying gas onto the bottom surface of the substrate W. Alternatively, all of the second nozzles 352 may selectively spray the chemical solution, deionized water, and drying gas onto the bottom surface of the substrate W. While the processing fluid is supplied from the second nozzle member 350, the first nozzle member 420 may be controlled not to supply any processing fluid. That is, the supply of the processing fluid by the first nozzle member 420 may be completely blocked. However, alternatively, the first nozzle member 420 may be controlled to spray the processing fluid along with the second nozzle member 350 at the edge area of the bottom surface of the substrate W, thereby improving edge cleaning efficiency for the bottom surface of the substrate W.

In order to prevent re-contamination of the center area on the bottom of the substrate W by reattachment of cleaning liquid, particles, etc. to the center area on the bottom of the substrate W when the edge area of the bottom surface of the substrate W is cleaned by the second nozzle member 350, the gas supply unit 344 may form an air curtain by supplying gas in a direction substantially orthogonal to the bottom surface of the first nozzle member 420 while cleaning the edge area of the bottom surface of the substrate W is being performed. The gas supplied by the gas supply unit 344 may include an inert gas such as nitrogen or CDA.

In addition, as the exhaust process by the exhaust unit 330 is simultaneously performed while the cleaning process is performed on the edge area of the bottom surface of the substrate W, foreign substances and cleaning liquid detached from the bottom surface of the substrate W may be discharged from the processing space through the exhaust unit 330 as soon as they are detached from the bottom surface of the substrate W without floating in the processing space for a long time.

FIG. 9 shows a process in which the second nozzle member 350 dries the edge area of the bottom surface of the substrate W. FIG. 8 is a side view of FIG. 2 viewed from the A-A direction.

In the process of drying the edge area of the bottom surface of the substrate W, the second nozzle member 350 positioned below the edge area of the substrate W may be controlled not to supply the processing fluid toward the bottom surface of the substrate W.

That is, when the edge area of the bottom surface of the substrate W is dried, only the gas supply unit 344 may be controlled to supply gas toward the bottom surface of the substrate W. The gas supplied by the gas supply unit 344 may include an inert gas such as nitrogen or CDA. The cleaning liquid remaining on the edge area of the bottom surface of the substrate W may be removed by the gas supplied to the bottom surface of the substrate W by the gas supply unit 344.

In addition, as the exhaust process by the exhaust unit 330 is simultaneously performed while the drying process is performed on the edge area of the bottom surface of the substrate W, foreign substances and cleaning liquid detached from the bottom surface of the substrate W may be discharged from the processing space through the exhaust unit 330 as soon as they are detached from the bottom surface of the substrate W without floating in the processing space for a long time.

Alternatively, when the edge area of the bottom surface of the substrate W is dried, the second nozzle member 350 positioned below the edge area of the substrate W may be controlled to supply only the drying gas toward the bottom surface of the substrate W. That is, the plurality of second nozzles 352 may only supply the drying gas toward the bottom surface of the rotating substrate W supported by the substrate support unit 340. The drying gas may include an inert gas such as nitrogen or CDA. In addition, the gas supply unit 344 may be controlled to supply gas toward the bottom surface of the substrate W together with the second nozzle member 350. The gas supplied by the gas supply unit 344 may include an inert gas such as nitrogen or CDA. The cleaning liquid remaining on the edge area of the bottom surface of the substrate W may be removed by the gas supplied to the bottom surface of the substrate W by the gas supply unit 344 and the second nozzle member 350.

When the edge area of the bottom surface of the substrate W is dried, the first nozzle member 420 may be controlled not to supply any processing fluid. That is, the supply of the processing fluid by the first nozzle member 420 may be completely blocked. However, alternatively, the first nozzle member 420 may be controlled to spray the drying gas along with the second nozzle member 350 at the edge area of the bottom surface of the substrate W, thereby improving edge drying efficiency for the bottom surface of the substrate W.

Figure 10:
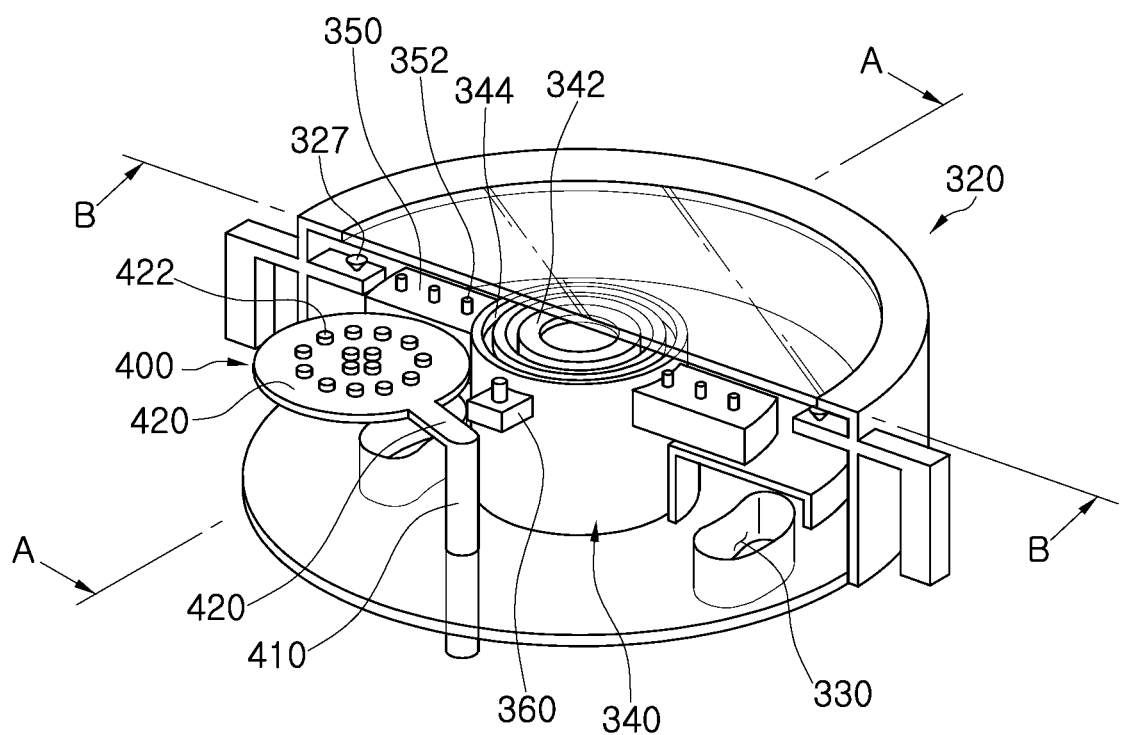
FIGS. 10 and 11 are perspective views showing the substrate processing apparatus according to modified examples of FIGS. 2 and 3.
Figure 11:
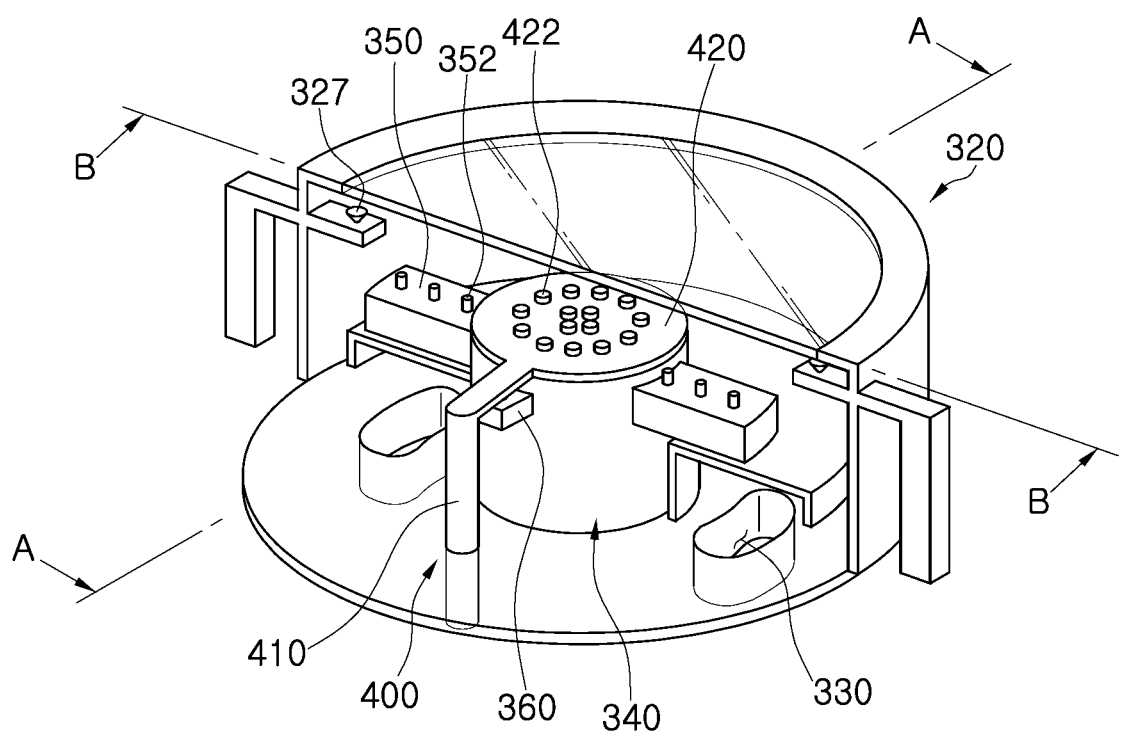

FIGS. 10 and 11 show variations of FIGS. 2 and 3. As described above, since all configurations except for the number and arrangement of the first nozzles 422 are the same, a detailed description thereof will be omitted.

Meanwhile, in the present specification, although an example in which the plurality of second nozzle members 350 are provided and extend in opposite directions from the substrate support unit 340 is illustrated, the second nozzle member 350 may be provided as one or may be provided in greater numbers, and the arrangement thereof is not limited thereto either.

Hereinafter, with reference to FIG. 12, the substrate processing method according to an embodiment of the present disclosure described with reference to FIGS. 4 to 9 will be schematically described. FIG. 12 is a flowchart schematically illustrating a substrate processing method according to an embodiment of the present disclosure. It has been described above with reference to FIGS. 4 to 9, but more briefly, the substrate processing method according to an embodiment of the present disclosure may include a cleaning area selection step (S100), a cleaning step, and an additional cleaning selection step (S300). That is, FIG. 12 includes the contents described with reference to FIGS. 4 to 9.

In general, in a substrate processing method of cleaning the bottom surface of a substrate, cleaning the edge area after cleaning the center area may be preferable in terms of particles. However, depending on the design, the edge area may be cleaned first and then the center area may be cleaned. Therefore, the first step of selecting a cleaning area (S100) may be performed. The step of selecting a cleaning area (S100) may include determining whether the selected area is a center area (S110).

Afterwards, a cleaning step may be performed. When the selected area is the center area, a center cleaning step (S210) may be performed, and when the selected area is an edge area, an edge cleaning step (S220) may be performed.

The center cleaning step (S210) may include: raising the substrate by raising the processing container (S211); rotating the first nozzle member to move the first nozzle member to a position corresponding to the center of the substrate under the substrate (S212); operating (ON) the first nozzle member (S213), checking whether the center cleaning is completed (S214), and stopping (OFF) the operation of the first nozzle member (S215). The step of operating (ON) the first nozzle member (S213) may include both a cleaning process and a drying process of the center area on the bottom surface of the substrate W.

The edge cleaning step (S220) may include: positioning the first nozzle member in the edge area (S221); adsorbing and rotating the substrate (S222); operating (ON) the second nozzle member (S223); checking whether the edge cleaning is completed (S224); and stopping (OFF) the operation of the second nozzle member (S225). The step of positioning the first nozzle member in the edge area (S221) may include rotating and moving the first nozzle member to the edge area and lowering the first nozzle member, the step of adsorbing and rotating the substrate (S222) may include lowering the processing container and the substrate to place the substrate on the substrate support unit, and the step of operating (ON) the second nozzle member (S223) may include both a cleaning process and a drying process of the edge area on the bottom surface of the substrate W.

When the center cleaning step (S210) or the edge cleaning step (S220) is completed, additional cleaning may be selected (S300). The cleaning process for a substrate may be terminated if there is no need to perform additional cleaning. On the other hand, if additional cleaning is to be performed, the subsequent steps may be performed by returning to the step of selecting a cleaning area (S100).

For example, the edge cleaning step (S220) may be performed on a substrate on which the center cleaning step (S210) has been completed. Alternatively, the center cleaning step (S210) may be performed again on a substrate on which the center cleaning step (S210) has been completed.

As another example, the center cleaning step (S210) may be performed on a substrate on which the edge cleaning step (S220) has been completed. Alternatively, the edge cleaning step (S220) may be performed again on a substrate on which the edge cleaning step (S220) has been completed.

According to the present disclosure described above, both center cleaning and edge cleaning for the bottom surface of a substrate may be performed on the substrate support member since the processing container (e.g., a bowl or cup) provided to surround the substrate to form a cleaning space of the substrate is provided to move the substrate up and down, the first nozzle for cleaning the center area of the bottom surface of the substrate is provided to be able to move up and down and rotate on one side of the cleaning space, and the second nozzle for cleaning the edge area of the bottom surface of the substrate is provided and fixed to the substrate support unit supporting the substrate. That is, since the cleaning process for the bottom surface of the substrate can be performed without moving the position of the substrate, it is advantageous for process and footprint optimization.

Furthermore, since the first nozzle rotatably provided may serve as a cover for the substrate support member and a gas supply unit supplying gas from below the substrate toward the substrate forms an air curtain to protect the substrate support unit, contamination of the substrate support unit can be prevented and the exhaust efficiency can be improved due to the position fixing of the processing container and the substrate, which is advantageous for particle control.

The above detailed description illustrates the present disclosure. In addition, the foregoing describes preferred embodiments of the present disclosure, and the present disclosure may be used in various other combinations, modifications, and environments. That is, the present disclosure may be changed or modified within the scope of the concept of the invention disclosed herein to the extent equal to the published disclosure and/or to the extent of skill or knowledge of a person skilled in the art. The authored embodiments describe the best state for implementing the technical idea of the present disclosure, and various changes required are possible according to the specific application field and use of the present disclosure. Therefore, the above detailed description of the present disclosure is not intended to limit the present disclosure to the disclosed state of implementation. In addition, the attached claims should be construed to include other states of implementation.

What is claimed is:

1. A substrate processing apparatus, comprising:
    a processing container configured to form a processing space for a substrate;
    a substrate support unit provided inside the processing space and configured to support the substrate;
    a first nozzle member provided on a side of the substrate support unit inside the processing space and supplying a processing fluid toward a center area of a bottom surface of the substrate; and
    a second nozzle member provided to be fixedly coupled to the substrate support unit and supplying a processing fluid toward an edge area of the bottom surface of the substrate,
    wherein the first nozzle member is provided to rotate between a center position and an end position of the bottom surface of the substrate.

2. The substrate processing apparatus of claim 1, wherein the processing container and the first nozzle member are provided to be movable up and down in a vertical direction.

3. The substrate processing apparatus of claim 2, wherein the processing container includes a side chuck for supporting the bottom surface of the substrate.

4. The substrate processing apparatus of claim 2, wherein driving of the processing container, the substrate support unit, the first nozzle member, and the second nozzle member is controlled according to a cleaning area of the substrate.

5. The substrate processing apparatus of claim 4, wherein when cleaning the center area of the bottom surface of the substrate, the substrate is lifted from the substrate support unit by raising the processing container, the first nozzle member is moved to a position corresponding to a center of the substrate under the substrate, and while the first nozzle member supplies a processing fluid toward the bottom surface of the substrate, the second nozzle member is controlled not to supply a processing fluid.

6. The substrate processing apparatus of claim 4, wherein when cleaning the edge area of the bottom surface of the substrate, the first nozzle member is moved to a position corresponding to an end of the substrate under the substrate, the substrate is seated on the substrate support unit by lowering the processing container, the substrate support unit rotates the substrate in a state in which the substrate is adsorbed, and while the second nozzle member supplies a processing fluid toward the bottom surface of the substrate, the first nozzle member is controlled not to supply a processing fluid.

7. The substrate processing apparatus of claim 4, wherein when cleaning the edge area of the bottom surface of the substrate, the first nozzle member is moved to a position corresponding to an end of the substrate under the substrate, the substrate is seated on the substrate support unit by lowering the processing container, the substrate support unit rotates the substrate in a state in which the substrate is adsorbed, and while the second nozzle member supplies the processing fluid toward the bottom surface of the substrate, the first nozzle member is controlled to supply the processing fluid toward the bottom surface of the substrate together.

8. The substrate processing apparatus of claim 1, wherein the substrate support unit comprises:
 a substrate support member configured to support the substrate; and
 a gas supply unit provided in a form surrounding an outer portion of the substrate support member and configured to supply gas toward the bottom surface of the substrate.

9. The substrate processing apparatus of claim 8, wherein the first nozzle member is provided with a size greater than or equal to an upper surface of the substrate support unit, and the second nozzle member is fixedly coupled to an outer wall of the substrate support unit and has a shape protruding from the substrate support unit toward the processing container.

10. The substrate processing apparatus of claim 9, wherein the first nozzle member and the second nozzle member each include a plurality of nozzles, and a flow rate of a processing fluid discharged from each nozzle of the first nozzle member and the second nozzle member is individually controllable.

11. The substrate processing apparatus of claim 10, wherein the plurality of nozzles of the second nozzle member are arranged in a line along a direction from the outer wall of the substrate support unit toward an inner wall of the processing container.

12. The substrate processing apparatus of claim 1, further comprising:
 an exhaust unit configured to evacuate the processing space.

13. Substrate processing equipment, comprising:
 a load port where a carrier containing a substrate is seated;
 an index frame with an index robot provided therein, the index robot being provided to transport the substrate from the carrier seated in the load port; and
 a process processing module configured to include a substrate processing apparatus that performs a liquid treatment process on the substrate,
 wherein the substrate processing apparatus comprises:
 a processing container configured to form a processing space for the substrate;
 a substrate support unit provided inside the processing space and configured to support and rotate the substrate;
 an upper fluid supply unit configured to supply a processing fluid to a top surface of the substrate; and
 a lower fluid supply unit configured to supply a processing fluid to a bottom surface of the substrate,
 wherein the lower fluid supply unit comprises:
 a first nozzle member provided on a side of the substrate support unit inside the processing space and supplying a processing fluid toward a center area of the bottom surface of the substrate; and
 a second nozzle member provided to be fixedly coupled to the substrate support unit and supplying a processing fluid toward an edge area of the bottom surface of the substrate,
 wherein the first nozzle member is provided to rotate between a center position and an end position of the bottom surface of the substrate.

14. The substrate processing equipment of claim 13, wherein the processing container and the first nozzle member are provided to be movable up and down in a vertical direction, and the processing container includes a side chuck for supporting the bottom surface of the substrate.

15. The substrate processing equipment of claim 14, wherein when cleaning the center area of the bottom surface of the substrate, the substrate is lifted from the substrate support unit by raising the processing container, the first nozzle member is moved to a position corresponding to a center of the substrate under the substrate, and while the first nozzle member supplies a processing fluid toward the bottom surface of the substrate, the second nozzle member is controlled not to supply a processing fluid, and
 wherein, when cleaning the edge area of the bottom surface of the substrate, the first nozzle member is moved to a position corresponding to an end of the substrate under the substrate, the substrate is seated on the substrate support unit, the substrate support unit rotates the substrate in a state in which the substrate is adsorbed, and the second nozzle member is controlled to supply a processing fluid toward the bottom surface of the substrate.

* * * * *